US009650808B2

(12) United States Patent
Martel et al.

(10) Patent No.: US 9,650,808 B2
(45) Date of Patent: May 16, 2017

(54) SELF-POWERED LOCK SYSTEM WITH PASSIVE ID DETECTION

(75) Inventors: Sylvain Martel, Laval (CA); Catalin Nastasa, Montreal (CA)

(73) Assignee: KABA ILCO CORP., Montreal (CA)

( * ) Notice: Subject to any disclaimer, the term of this patent is extended or adjusted under 35 U.S.C. 154(b) by 830 days.

(21) Appl. No.: 13/538,386

(22) Filed: Jun. 29, 2012

(65) Prior Publication Data

US 2013/0000366 A1 Jan. 3, 2013

Related U.S. Application Data

(60) Provisional application No. 61/503,041, filed on Jun. 30, 2011.

(51) Int. Cl.
*H05K 7/14* (2006.01)
*E05B 47/00* (2006.01)
*G07C 9/00* (2006.01)

(52) U.S. Cl.
CPC .......... *E05B 47/00* (2013.01); *G07C 9/00944* (2013.01); *E05B 2047/0058* (2013.01); *E05B 2047/0062* (2013.01); *E05B 2047/0087* (2013.01); *Y10T 70/7113* (2015.04)

(58) Field of Classification Search
CPC .... G01P 13/00; G01P 3/4802; A47L 15/4259; B41J 3/36; B65H 59/40; B60R 25/10; E05B 47/00; B65D 55/14; H04Q 9/00
USPC ................... 307/149, 104, 9.1, 66, 39, 10.1; 340/425.5, 426.1, 429, 543; 70/159
See application file for complete search history.

(56) References Cited

U.S. PATENT DOCUMENTS 4,665,397 A * 5/1987 Pinnow .................. G04G 21/00 340/5.64
4,931,789 A * 6/1990 Pinnow .................. G04G 21/00 340/5.22
5,196,781 A * 3/1993 Jamieson .................. H02J 7/35 136/291
7,495,549 B2 * 2/2009 Acres ....................... B62J 6/003 340/425.5
8,093,986 B2 * 1/2012 Harvey ........................ 340/5.21
9,080,349 B2 * 7/2015 Burrus .................... E05B 37/00
2005/0099262 A1 * 5/2005 Childress ........... G07C 9/00309 340/5.6

(Continued)

*Primary Examiner* — Fritz M Fleming
*Assistant Examiner* — Jagdeep Dhillon
(74) *Attorney, Agent, or Firm* — Norton Rose Fulbright Canada LLP

(57) ABSTRACT

There is described a self-powered lock system for a movable member coupled to a lock mechanism having a first state in which the movable member is locked and a second state in which the movable member is unlocked. The system comprises an electrical energy storage device having an electrical charge stored therein, a control unit for controlling the lock mechanism, a trigger unit for triggering an unlocking of the lock mechanism, and a passive detection unit for detecting an activation of the trigger unit. Upon detection of the activation, a conductive path is provided between the control unit and the storage device for powering the control unit with the charge stored in the storage device. The lock mechanism is in turn unlocked by the control unit. A generator coupled to the storage device may then generate electrical energy and store the generated energy in the storage device for future use.

19 Claims, 4 Drawing Sheets

(56) References Cited

U.S. PATENT DOCUMENTS

| | | | | |
|---|---|---|---|---|
| 2007/0268132 | A1* | 11/2007 | Milo | E05B 47/02 340/545.1 |
| 2007/0296545 | A1* | 12/2007 | Clare | E05B 67/00 340/5.64 |
| 2008/0062013 | A1* | 3/2008 | Face | H03K 17/951 341/20 |
| 2010/0326146 | A1* | 12/2010 | Powers et al. | 70/159 |
| 2010/0332359 | A1* | 12/2010 | Powers | E05B 39/005 705/28 |
| 2011/0215921 | A1* | 9/2011 | Ben Ayed | G08B 1/08 340/539.11 |

* cited by examiner

SELF-POWERED LOCK SYSTEM WITH PASSIVE ID DETECTION

CROSS-REFERENCE TO RELATED APPLICATIONS

The present application claims priority on U.S. Application No. 61/503,041, filed on Jun. 30, 2011, and incorporated herein by reference.

TECHNICAL FIELD

The present invention relates to the field of electronic lock systems, and particularly to self-powered electronic lock systems.

BACKGROUND

Electronic or electric lock systems include locking devices that operate by means of an electrical current. Some electronic lock systems are powered by an external electrical energy source. For example, an electronic lock system can be line-powered, i.e. powered from a standard electrical utility system. In another example, an electronic lock system can be battery-powered.

Other electronic lock systems are self-powered and comprise an electrical energy generator which is driven by a door handle or lever used by a user for opening the door to which the self-powered lock system is secured.

Some electronic lock systems comprise an authentication device for authenticating and granting access to a user. For electronic lock systems powered by an external power source, the user first enters his identification (ID) using the authentication device. If the ID is valid, the lock mechanism is unlocked and the user is free to open the door. For self-powered electronic lock systems, the user has first to manually activate the door handle connected to the generator for powering the lock system. When sufficient energy has been generated, the electronic lock provides the user with a visual or audible signal for indicating that it is ready to be used. The user then authenticates himself using the authentication system and the lock mechanism is unlocked. Having to activate the door handle before authentication is not intuitive since externally powered electronic lock systems do not require any action from the user before authentication. Therefore, users of a self-powered electronic lock have to be instructed on the method of using the self-powered electronic lock system, which is time-consuming in addition of being inconvenient.

Therefore, there is a need for an improved self-powered electronic lock system.

SUMMARY

According to a first broad aspect, there is provided a self-powered lock system for a movable member, the system comprising an energy storage device having an electrical charge stored therein; a generator coupled to the storage device and adapted to generate electrical energy; a lock mechanism having a first state in which the movable member is locked and a second state in which the movable member is unlocked; a control unit coupled to the lock mechanism and adapted to place the lock mechanism in one of the first state and the second state; a trigger unit adapted to be activated with the lock mechanism in the first state, an activation of the trigger unit triggering a placement of the lock mechanism in the second state; and a passive detection unit coupled to the trigger unit and to the control unit, the detection unit detecting the activation of the trigger unit and, upon detection of the activation, providing a conductive path between the control unit and the storage device, thereby powering the control unit with the stored electrical charge, the control unit, upon being powered, placing the lock mechanism in the second state and triggering a storage of the generated electrical energy in the storage device for future use.

According to a second broad aspect, there is provided a control system for controlling a self-powered electronic lock for a movable member, the lock comprising an electrical energy generator and a lock mechanism having a first state in which the movable member is locked and a second state in which the movable member is unlocked, the control system comprising an energy storage device having an electrical charge stored therein; a control unit coupled to the lock mechanism and adapted to place the lock mechanism in one of the first state and the second state; a trigger unit adapted to be activated with the lock mechanism in the first state, an activation of the trigger unit triggering a placement of the lock mechanism in the second state; and a passive detection unit coupled to the trigger unit and to the control unit, the detection unit detecting the activation of the trigger unit and, upon detection of the activation, providing a conductive path between the control unit and the storage device, thereby powering the control unit with the stored electrical charge, the control unit, upon being powered, placing the lock mechanism in the second state and triggering a storage of the generated electrical energy in the storage device for future use.

In accordance with a further broad aspect, there is provided a method for controlling an electronic lock of a movable member, the method comprising passively detecting an activation of a trigger unit with the lock in a locked state; upon said detection, providing a conductive path between a control unit coupled to the lock and a storage device having an electrical charge stored therein, thereby powering the control unit with the stored electrical charge; upon said powering, the control unit placing the lock in an unlocked state; and charging the storage device for a next use with electrical energy generated by a generator coupled to the storage device.

The present self-powered electronic lock system may be operated as a battery-powered electronic lock system. In one embodiment, the generator is an electric generator operatively connected to a door lever to convert at least some of the mechanical energy generated during a manual operation of the door lever to electrical energy. Each time the generator is driven by the manual operation of a door lever during use of the lock system, the electrical energy generated by the generator is stored for a next use. Since the electrical energy is generated and accumulated during a normal operation of the lock system, the lock system may be seen as having "energy harvesting" capabilities. As a result, the user uses the present self-powered electronic lock system as he would use a battery-powered electronic lock system, i.e. the user first enters a user ID and then opens the door by operating the door lever, for example.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION

Figure 1:
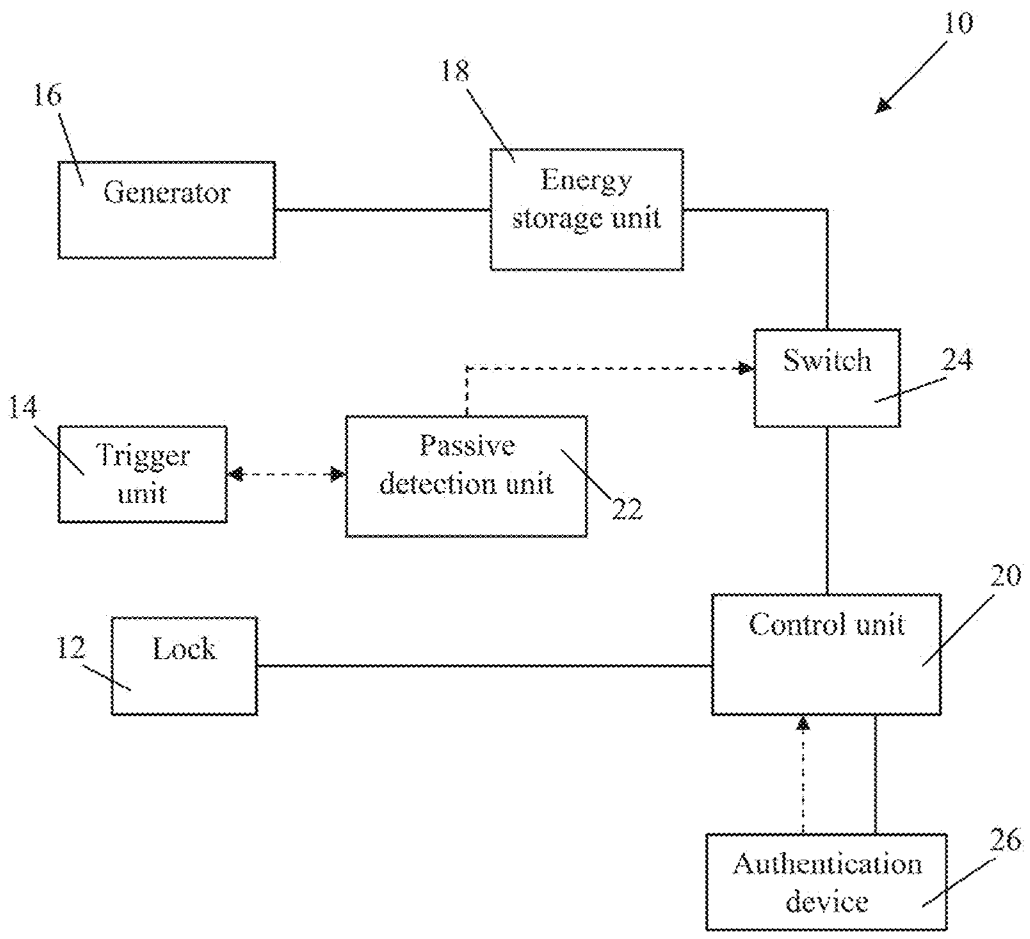
FIG. 1 is a block diagram of a self-powered electronic lock system, in accordance with a first embodiment.

FIG. 1 illustrates one embodiment of a self-powered electronic lock system 10 comprising a lock mechanism 12 of which the unlocking is triggered by a trigger unit 14. The lock system 10 further comprises a generator 16 to be manually operated for generating electrical energy, an electrical energy storage unit 18 for storing the electrical energy generated by the generator 16, a control unit 20 for controlling the operation of the lock system 10, a passive detection unit 22 adapted to detect the activation of the trigger unit 14 while consuming no electrical energy, and a switch 24.

The generator 16 is operatively connected to a door handle or lever (not shown) of which a displacement drives the generator 16. The door handle may be any adequate mechanical device that can be used for opening a door and operatively connected to the generator 16 so as to drive the generator 16 upon operation by a user, i.e. when the user displaces the mechanical device. Examples of adequate door handles comprise a knob, a lever, a panic bar, and the like. The generator 16 is electrically connected to the electrical energy storage unit 18 so that electrical energy generated by the generator 16 upon operation of the door handle by a user is stored therein. The switch 24 electrically connects the electrical energy storage unit 18 and the control unit 20 and controls the powering of the control unit 20 from the electrical energy storage unit 18. The control unit 20 is configured for powering the lock mechanism 12 in order to unlock the lock mechanism 12.

In one embodiment, the self-powered electronic lock system 10 further comprises an authentication unit 26 connected to the control unit 20. Once the trigger unit 14 has been activated by the user and the control unit 20 has been powered, the authentication unit 26 is powered by the control unit 20. The authentication unit 26 is used by the user to enter an identification which is transmitted to the control unit 20. The control unit 20 then compares the received user ID to a list of authorized IDs. If the user ID is valid, then the control unit 20 powers and unlocks the lock mechanism 12. It should be understood that any adequate authentication unit 26 may be used. For example, the authentication unit 26 can be a keypad for entering a numerical code, password, and/or passphrase, a biometric sensor, a radio-frequency identification (RFID) reader for reading an RFID tag, or the like.

While the closing of the switch 24 is controlled by the passive detection unit 22, different scenarios for the subsequent opening of the switch 24 may be possible. In one example, the switch 24 is adapted to close for powering the control unit 20 for a predetermined period of time. In another example, the opening of the switch 24 is controlled by the control unit 20. In this case, the control unit 20 may be adapted to send a control signal to the switch 24 as long as it requires to be powered and the switch 24 opens as soon as no control signal is received from the control unit 20. In a further example, the switch 24 remains closed for powering the control unit 20 as long as no stop signal is received from the control unit 20.

In one embodiment, the control unit 20 is configured for unlocking the lock mechanism 12 for a predetermined period of time such as 2 s, 5 s, or the like. It should be understood that the predetermined period of time is chosen as a function of the storage capacity of the energy storage unit 18 and the electrical consumption of the system 10. Once the predetermined period of time has elapsed, the control unit 20 stops powering the lock mechanism 12 which locks. Alternatively, the control unit 20 may send a lock signal to the lock mechanism 12 in order to lock the lock mechanism 12 while still powering the lock mechanism 12.

The generator 16 may be any adequate device that generates electrical energy using a source of energy other than electrical energy. For example, the generator 16 may be an electric generator that converts mechanical energy generated by the activation of the door handle to electrical energy, as described above. For example, the generator 16 may be an electrical motor, a step motor, or the like. While in the description it is operatively connected to a door handle, it should be understood that the electric generator may be operatively connected to the door so that electrical energy be generated while a user opens the door. The generator 16 may also generate electrical energy from energy sources other than mechanical energy source, such as thermal or solar energy source. For example, the generator may be solar cell or a combination of solar cells installed on the door for example.

The electrical energy storage unit 18 may be any adequate device adapted to store electrical energy. Examples of adequate electrical energy storage unit comprise rechargeable batteries, capacitors such as aluminum electrolytic capacitors or solid-state capacitors for example, supercapacitors, and the like.

The lock mechanism 12 may be any adequate door fastener of which the locking and unlocking may be electrically controlled. For example, the lock mechanism 12 may be a magnetic lock, an electric lock or electric latch release, or the like. The lock mechanism 12 may also be a mechanical piece operatively connected to a door latch and movable between a first position in which the latch is allowed to move, thereby allowing a user to open the door, and a second position in which the latch is prevented from moving, thereby preventing the user from opening the door.

It should be understood that the lock system 10 may be used for controlling the lock/unlock state of any movable structure used to close off an entrance. For example, the lock system 10 may be used for controlling an entrance door, a safety door, a safe door, or the like.

Figure 2:
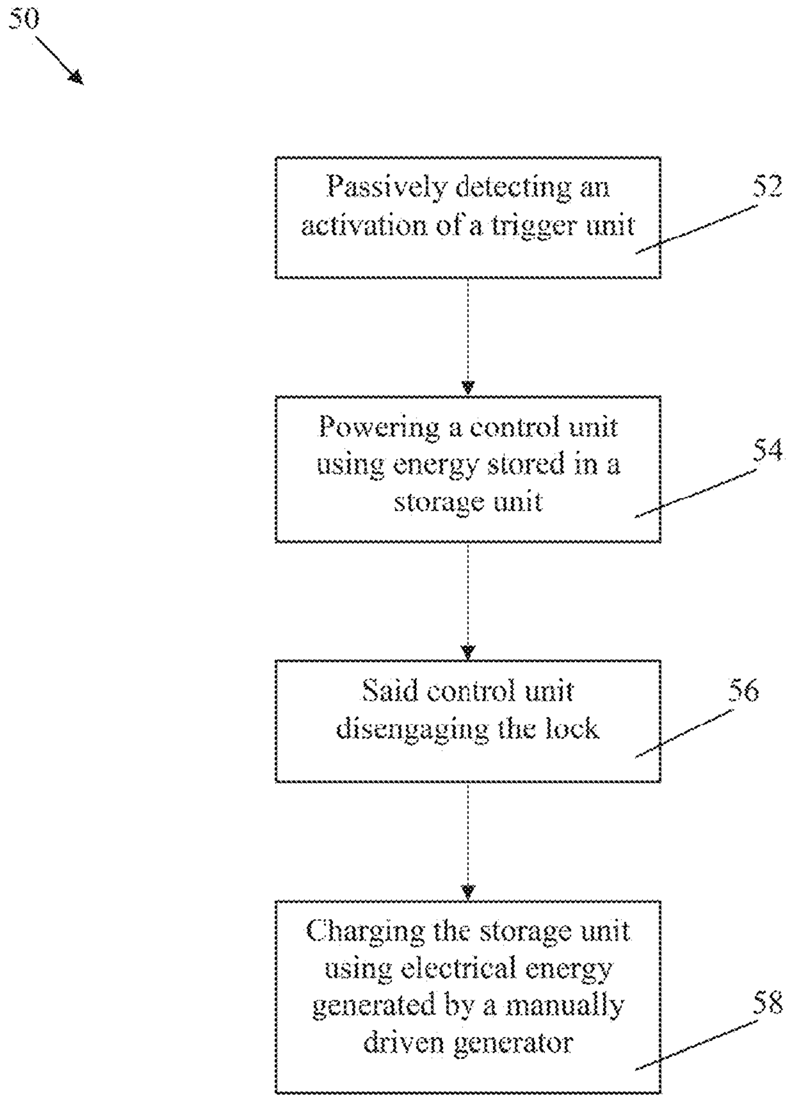
FIG. 2 is a flow chart illustrating a method for operating a self-powered electronic lock system, in accordance with an embodiment.

FIG. 2 illustrates one embodiment of a method 50 for operating the electric lock system 10. The first step 52 comprises passively detecting a manual activation of the trigger unit 14 via the passive detection unit 22. It should be understood that this step requires substantially no electrical energy consumption since the passive detection unit 22 consumes substantially no electrical energy for detecting the manual activation of the trigger unit 14. Upon detection of the activation of the trigger unit at step 52, the passive detection unit 22 is powered using the energy stored in the energy storage unit 18 and triggers the closing of the switch 24, and therefore the powering of the control unit 20 by the energy storage unit 18 via the switch 24, at step 54. Similarly, the triggering of the closing of the switch 24 by the passive detection unit 22 requires substantially no electrical energy consumption since the passive detection unit 22 consumes substantially no electrical energy until the closing of the switch 24.

At step 56, the control unit 20 triggers the unlocking of the lock mechanism 12 by powering the lock unit 12 using the energy received from the energy storage unit 18. A visual and/or audible signal indicative of the unlock status for the lock mechanism 12 may be provided to the user for indicating that the lock device is unlocked. At step 58, the user charges the energy storage unit 18 by opening the door. Since the door handle is operatively connected to the generator 16, the operation of the door handle drives the generator 16 which generates electrical energy. The electrical energy generated by the generator 16 is then stored in the energy storage unit 18 for a future opening of the door.

It should be understood that the energy storage unit 18 is charged before the first use of the self-powered electronic lock system 10. Then, each operation of the handle for opening of the door charges the energy storage unit 18 for a subsequent use of the lock system 10.

Figure 3:
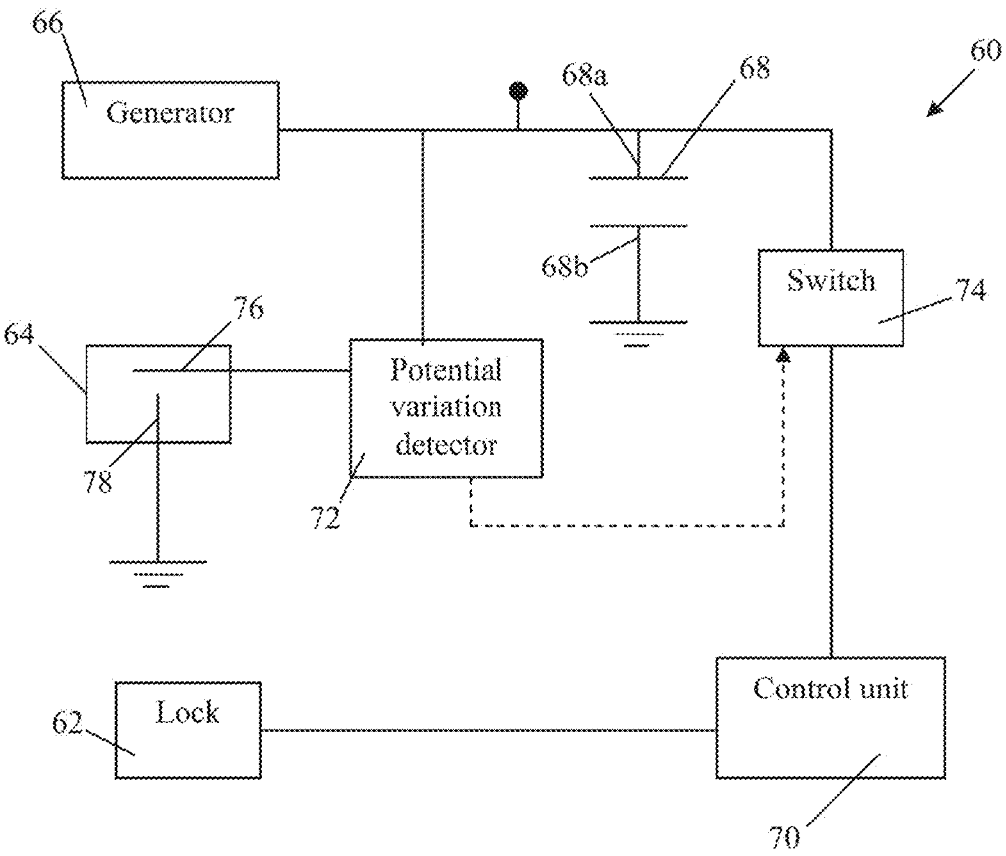
FIG. 3 is a block diagram of a self-powered electronic lock system, in accordance with another embodiment.

The passive detection unit 22 may be any adequate unit adapted to detect a manual activation of the trigger unit 14 while consuming substantially no electrical energy, and trigger the closing of the switch 24. FIG. 3 illustrates one embodiment of a self-powered electronic lock system 60 comprising a trigger switch 64 for triggering the unlocking of a lock mechanism 62. The lock system 60 further comprises a generator 66 operatively connected to a door handle (not shown) to be manually operated for generating electrical energy, a capacitor 68 for storing the electrical energy generated by the generator 66, a control unit 70 for controlling the operation of the lock system 60, a potential variation detector 72 adapted to detect the activation of the trigger switch 64 while consuming substantially no electrical energy and trigger the powering of the control unit 70, and a switch 74 connected between the capacitor 68 and the control unit 70. The capacitor 68 has one terminal 68*a* connected to the potential variation detector 72 and the switch 74 while the other terminal 68*b* is grounded.

The trigger switch 64 comprises first and second electrical contacts 76 and 78. The trigger switch 64 further comprises a mechanical movable connector (not shown) to be manually operated for electrically connecting the two contacts 76 and 78 together. In one example, one of the two contacts 76 and 78 may be movable between an open position in which the movable contact is away from the other contact and a closed position in which the movable contact is electrically connected to the other contact. In this case, the mechanical connector may be a push button to be manually operated by a user for moving the movable contact in the closed position. In another example, the two contacts 76 and may have a fixed relative position and the mechanical connector may be a push button provided with an electrical conductor element for electrically connecting the two contacts 76 and 78 upon depression of the push button by the user. It should be understood the mechanical connector may be any adequate mechanical device which allows the two contacts 76 and 78 to be electrically connected together upon manual operation thereof. While the description refers to a push button, other examples of adequate mechanical connectors comprise a switch, a lever, and the like.

In the open position, the two contacts 76 and 78 are each maintained at a different electrical potential. The contact 76 is connected to the terminal 68*a* of the capacitor via the potential variation detector 72 so that the contact 76 be maintained at a first non-zero electrical potential while the contact 78 is maintained at a second electrical potential different from the first electrical potential. For example, the contact 78 may be grounded.

Upon manual operation of the trigger switch 64 by the user in order to trigger the unlocking of the lock mechanism 62, the two contacts 76 and 78 are electrically connected together and the electrical potential of the contact 76 varies. The potential variation detector 72 detects the variation of electrical potential for the contact while consuming substantially no electrical energy. The variation of electrical potential triggers the powering of the potential variation detector 72 from the capacitor 68. Once powered, the potential variation detector 72 closes the switch 74 to power the control unit 70 using the energy stored in the capacitor 68. Then the control unit 70 powers the lock mechanism 62 which unlocks for a predetermined period of time before locking again. In one embodiment, the control unit 70 powers the lock mechanism 62 during the whole predetermined period of time. Alternatively, the control unit powers the lock mechanism 62 for unlocking the lock, then stops powering the lock mechanism 62, and then powers again the lock mechanism 62 for locking the lock mechanism 62 after the predetermined period of time.

In one embodiment, the lock system 60 may further comprise an authentication unit powered by the control unit 70. In this case, the authentication is adapted to allow a user to enter his user ID. The user ID is then sent to the control unit 70 which verifies whether the user ID is valid before unlocking the lock mechanism 62. In one embodiment, the authentication unit is integral with the trigger switch 64. One example of an adequate integrated authentication unit and trigger switch may be a keypad which is used by the user to enter a numerical code, password, and/or passphrase.

Figure 4:
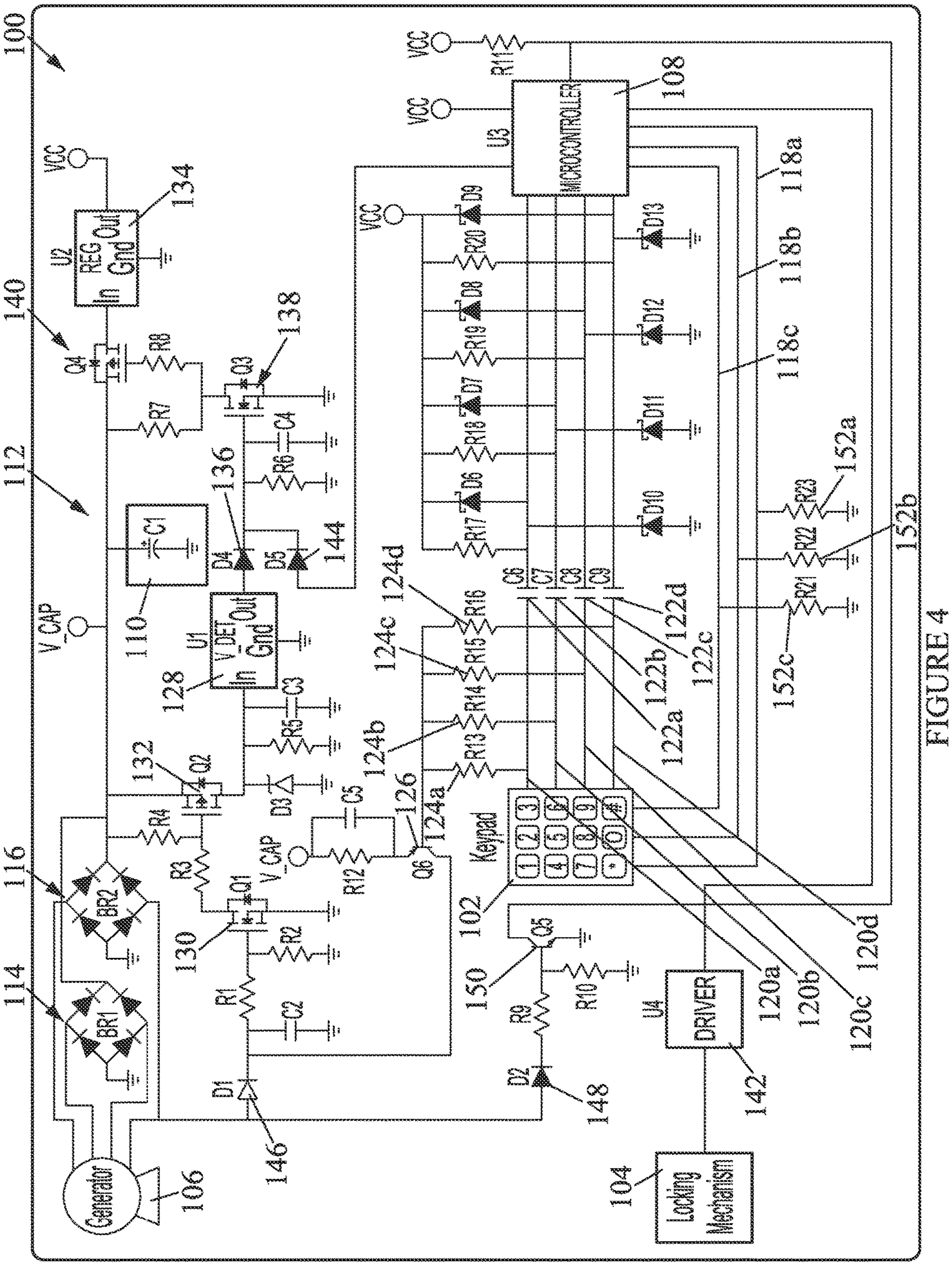
FIG. 4 illustrates a self-powered electronic lock system comprising electronic circuitry, in accordance with an embodiment.

FIG. 4 illustrates one embodiment of a self-powered electronic lock system 100 comprising a keypad 102 for both triggering the powering of the lock system in order to unlock a lock mechanism 104 and entering a user ID. The lock system 100 is adapted to detect a key activation on the keypad 102 without any active power consumption. As a result, the lock system 100 operates as a battery powered lock system since the user can simply first enter his user ID before operating the door handle for opening the door.

The lock system 100 further comprises a generator 106 for generating electrical energy, a microcontroller 108 for controlling the operation of the lock system 100, a capacitor 110 for storing electrical energy, and an electronic circuit 112 which interconnects the keypad 102, the lock mechanism 104, the generator 106, the capacitor 110, and the microcontroller 108 together. The generator 106 is operatively connected to the handle of the door which is provided with the lock mechanism 104, for example. The manual operation of the door handle by a user drives the generator 106 which generates electrical energy. The generated electrical energy is then stored in the capacitor 110.

As illustrated in FIG. 4, the generator 106 is connected to the capacitor via two bridge rectifiers 114 and 116 which convert the Alternating Current (AC) electrical current generated by the generator 106 into an adequate Direct Current (DC) electrical current for charging the capacitor 110. It should be understood that the capacitor 110 is chosen to store therein enough energy for powering the lock system 100 during at least one use thereof. Similarly, the generator 106 is chosen to generate enough electrical energy for charging the capacitor 110 during a single manual operation of the door handle.

The keypad 102 comprises a plurality of buttons or keys organized as rows and columns to form a matrix. In the present embodiment, the keypad buttons are organized according to a matrix comprising three columns and four rows. Each button column is associated with a respective column electrical connection 118*a*, 118*b*, 118*c* which is connected to the microcontroller 108. For example, the buttons of the first column, i.e. the “1”, “4”, “7”, and “*” buttons, are each associated with the column electrical connection 118*a*. Each button row is associated with a respective row electrical connection 120*a*, 120*b*, 120*c*, 120*d* which is also connected to the microcontroller 108. For example, the buttons of the second row, the “4”, “5”, and “6” buttons, are each associated with the row electrical connection 120*b*. When the keypad is not used, the row and column electrical connections 118*a*-118*c* and 120*a*-120*d* are not electrically connected together. By depressing a given keypad button, its respective row and column electrical connections electrically connect together. For example, by depressing the button “8” of the keypad, the row electrical connection 120*c* and the column electrical connection 118*b* electrically connect together.

A capacitor 122*a*, 122*b*, 122*c*, and 122*d* is present along a respective row electrical connection 120*a*, 120*b*, 120*c*, and 120*d* between the keypad 102 and the microcontroller 108. Each capacitor 122*a*, 122*b*, 122*c*, and 122*d* acts a filter which allows varying or AC electrical signals to propagate from the keypad 102 to the microcontroller 108 while preventing steady-state or DC electrical signals from propagating from the keypad 102 to the microcontroller 108. Each row electrical connection 120*a*, 120*b*, 120*c*, and 120*d* are electrically connected to the positive terminal of the capacitor 110 via a respective resistor 124*a*, 124*b*, 124*c*, and 124*d*, and a transistor 126. As a result, when the capacitor 110 is charged, each row electrical connection 120*a*, 120*b*, 120*c*, and 120*d* is maintained at a non-zero electrical potential. The capacitors 122*a*, 122*b*, 122*c*, and 122*d* act as an isolator between the microcontroller 108 and the row electrical connections 120*a*, 120*b*, 120*c*, and 120*d*, thereby allowing the electrical potential of the row electrical connections 120*a*, 120*b*, 120*c*, and 120*d* to be maintained. As a result, the voltage applied to the row electrical connections 120*a*, 120*b*, 120*c*, and 120*d* when the lock system 100 is not in use does not flow through the microcontroller 110 and substantially no electrical energy is consumed. Similarly, each column electrical potential 118*a*, 118*b*, and 118*c* is maintained an electrical potential which is different from that of the row electrical connection 120*a*, 120*b*, 120*c*, and 120*d*. For example, the column electrical potential 118*a*, 118*b*, and 118*c* may be grounded via resistors 152*a*, 152*b*, and 152*c*, respectively.

The transistor 126 is further electrically connected to a first voltage detector 128 via two transistors 130 and 132 such as bipolar junction transistors or metal-oxide-semiconductor field-effect transistors (MOSFETs) for example. The first voltage detector 128 is electrically connected to a regulator 134 via a diode 36 and two transistors 138 and 140. The regulator 134 is further electrically connected to the capacitor 10 via the transistor 140 and to the microcontroller 108 and is used for powering the microcontroller 108 using the electrical energy stored in the capacitor 110. In addition, the microcontroller 108 is connected to a driver 142 connected to the lock mechanism 104.

The lock system 100 operates as follows. It should be understood that the capacitor 110 has to be charged before the first use of the system 100. The door handle operatively connected to the generator 106 may be operated to drive the generator 106 and charge the capacitor 110 before the first use of the lock system 100.

Once the capacitor 110 has been charged, the self-powered lock system 100 can be used as a battery powered lock system, i.e. the user first enters his ID using the keypad 102 and then manually operates the handle to open the door.

In order to unlock the lock mechanism 104, a user first enters his ID using the keypad 102. The user starts by depressing the button corresponding to the first ID element, such as the “3” button for example. The depression of the button electrically connects its respective row and column electrical connections together. Since the respective row and column electrical connections are maintained at different electrical potentials before the depression of the keypad button, electrically connecting the respective row and column electrical connections together changes the electrical potential of the respective row electrical connection. For example, the depression of the “3” button interconnects the row electrical connection 120*a* and the column electrical connection 118*c* together, and the electrical potential of the row electrical connection 120*a* varies. In the present embodiment, the electrical potential for the row electrical connection 120*a* decreases down to a low level, such as close to zero for example, since the column electrical connection 118*c* is grounded via resistor 152*c*. The transistor 126 which acts as a passive potential detector detects the variation of electrical potential for the respective row electrical connection, such as electrical connection 120*a* for example, while consuming no electrical energy. The variation of electrical potential triggers the powering of the electric circuit 112. The variation of electrical potential for the respective row electrical connection activates the transistor 126 so that it conducts and activates in turn the transistor 130. When the transistor 130 conducts, the transistor 132 is activated which allows electrical energy stored in the capacitor 110 to reach the voltage detector 128. If the voltage applied to the detector 128 is above a predetermined threshold, the voltage detector 128 outputs a logic high which activates the transistor 138 via the diode 136, which in turn activates the transistor 140. When the transistor 140 conducts, the regulator 134 is powered by the capacitor 110, which in turn powers the microcontroller 108.

When powered, the microcontroller 108 first receives the user ID from the keypad, then determines the validity of the user ID, and finally unlocks the lock mechanism 104 if the user ID is valid. The reception of the user ID by the microcontroller 108 from the keypad 102 occurs as follows. Once powered, the microcontroller 108 sends an electrical pulse on each column electrical connection 118*a*, 118*b*, and 118*c* towards the keypad 102. When a particular button is depressed, its corresponding row and column electrical connections electrically interconnects and the electrical pulse propagating on the corresponding column electrical connection can reach the corresponding row electrical connection. Then, the electrical pulse propagates on the corresponding row electrical connection up to the microcontroller 108 via the capacitor 122*a*-122*d* present along the corresponding electrical row connection since the electrical pulse is a varying signal and can therefore be transmitted by the corresponding capacitor 122*a*-122*d*. Knowing from which row electrical connection the pulse signal is received, the microcontroller 108 can determine which keypad button is depressed. Following the detection of the depression of a second keypad button, the microcontroller 108 sends another pulse signal on each column electrical connection 118*a*, 118*b*, and 118*c* in order to determine the second ID code element entered by the user, i.e. to identify the second keypad button that is being depressed by the user.

Referring back to the example in which the first ID element entered by the user is a "3", i.e. when the user first depresses the "3" button, the electrical connections 118*c* and 120*a* electrically connect together so that the electrical pulse propagating on the column electrical connection 118*c* reaches the row electrical connection 120*a* before propagating up to the microcontroller 108 via the capacitor 122*a*. Upon reception of the signal from the row electrical connection 120*a*, the microcontroller 108 determines that the "3" button is depressed. Then, after the detection of the depression of a second keypad button, the microcontroller 108 sends a second electrical pulse on each one of the column electrical connections 118*a*, 118*b*, and 118 to identify the second depressed keypad button.

It should be understood that the time required for detecting that a button has been depressed, powering the microcontroller 108 and determining which button has been depressed is shorter or substantially equal to the time during which the button is depressed.

Once the microcontroller 108 has determined all of the ID elements, the validity of the user ID is verified. If the user ID is valid, the driver 142 is powered by the microcontroller 108. When powered, the driver 142 unlocks the lock mechanism 104 and a visual and/or audible signal (not shown) may be provided to the user for indicating that the lock mechanism 104 is unlocked. The user then operates the door handle for opening the door and the manual operation of the handle drives the generator 106. The electrical energy generated by the generator 106 is stored in the capacitor 110 for a next use of the lock system 100, i.e. the next unlocking of the lock mechanism 104.

As a result, the lock system 100 is capable of harvesting electrical energy generated from a normal operation in order to power the elements of the lock system 100. The energy stored during a particular operation is stored for a subsequent use of the lock system 100 and all of the elements of the lock system 100 are disconnected at the end of the particular operation, so that the lock system 100 consumes substantially no electrical energy between uses. The elements of the lock system 100 are then reconnected when the user depresses a key on the keypad 102 and the electrical energy previously generated and stored in the capacitor 110 is used for powering the lock system for the new operation cycle. Therefore, the lock system 100 may be used without having to activate the door handle before entering the user ID.

The electrical circuit 112 further comprises a diode 144 for electrically connecting the microcontroller 108 to the transistor 138. The microcontroller 108 can then force the regulator 134 to provide power thereto by applying an electrical signal, such as a high signal, to the transistor 138 via the diode 144 to activate the transistor 138 as long as the microcontroller 108 requires to be powered.

In one embodiment, the circuit 112 further comprises a diode 146 which connects the generator 106 to the transistor 130 in order to provide the microcontroller 108 with power during the operation of the generator 106. As a result, the operation of the door handle which drives the generator 106 causes the microcontroller 108 to be powered. Upon manual operation of the handle, the generator 106 applies an electrical signal to the transistor 130 through the diode 146 which converts the AC current generated by the generator 106 to a DC current. As described above, if the voltage detector 128 determines that the voltage of the capacitor 110 is greater than a predetermined threshold, then the transistors 138 and 140 are activated to provide the microcontroller 108 with power via the regulator 134.

In the same or another embodiment, the circuit 112 further comprises a diode 148 and a transistor 150 which connect the generator 106 to the microcontroller 108 for informing the microcontroller 108 that the generator 106 is in operation, assuming the microcontroller 108 is powered. Upon manual operation of the door handle, the generator 106 applies an electrical signal to the transistor 150 through the diode 148 which converts the AC current generated by the generator 106 to a DC current. When the transistor 150 conducts, an electrical signal, such as a pulsed signal for example, is applied to the microcontroller 108 which, if powered, determines that the generator operates.

While in the present description, the keypad buttons are organized as rows and columns, it should be understood that other configurations are possible. For example, the keypad buttons may be organized as a single row or column so that each button is associated with a respective column electrical connection 118 and a respective row electrical connection 120, and that each column electrical connection and each row electrical connection is associated with a single keypad button.

While the variation of the electrical potential of the row electrical connections 120*a*-120*d* is used for triggering the powering of the microcontroller 108, it should be understood that the electrical potential of the column electrical connections 118*a*-118*c* may be used for triggering the powering of the microcontroller 108. In this case, the column electrical connections 118*a*-118*c* are electrically connected to the transistor 126 so that their electrical potential be maintained to a first electrical potential and to the microcontroller 108 through the capacitors 122*a*-122*d*. The row electrical connections 120*a*-120*d* are then directly connected to the microcontroller 108 in addition to being grounded via the resistors 152*a*, 152*b*, and 152*c*.

The energy harvested during a door handle operation is at least equal to the energy used by the microprocessor 108 and the electronic circuit 112 during an opening cycle. Therefore, during a normal operation cycle where access is granted and the user operates the door handle, the energy stored in the storage capacitor 110 is sufficient for the next operation cycle. When the microcontroller 108 sends a stop signal, such as a low signal for example, to the transistor 138 through the diode 144 at the end of an opening cycle, the power provided to the electronics is turned off. The charge on the storage capacitor 110 is then conserved until the next opening cycle. As a result, the user can simply enter the code without prior operation of the door handle.

In one embodiment, if the user ID entered by the user is valid and access is granted, the microcontroller 108 sends a signal to the driver 142 for unlocking the lock mechanism 104. The user then operates the door handle to open the door and thus recharges the capacitor 100. After a predetermined period of time, the microcontroller 110 sends a second signal to the driver 142 to lock the lock mechanism 104 before sending a low signal to the transistor 138 through the diode 144 for turning off the power.

As described above, the electronic circuitry is completely disconnected between uses. When the lock system is not in use, the power consumption is only caused by the leakage of the semiconductor devices and capacitors. In one embodiment, a leakage current of about 50 pA or less may be achieved by adequately selecting the electric and electronic components. In comparison, the use of powered semiconductors such as low-power microcontrollers between lock uses would increase the power consumption by about three or four orders of magnitude.

While any adequate energy storage devices may be used for storing the electrical energy generated by the generator, it should be understood that the characteristics of the storage device will affect the end performance of the lock system. In one embodiment, a critical factor for the selection of the energy storage device may be the self-discharge characteristics. The internal leakage limits the time interval between uses of the lock system. However, by adequately choosing low leakage components, a time interval between uses of several months or even a full year may be obtained. Another important factor may be the ability for the energy storage device to accumulate the energy generated by the generator during a short period of time, i.e. the period of time during which the door lever is operated.

In one embodiment where the lock has not been used for a period of time long enough for depleting the storage device so that the level of charge would not be sufficient for an opening cycle, the lever would need to be operated in order to recharge the capacitor prior to entering the user ID.

The remaining resistors, capacitors, diodes and other circuit elements not otherwise described in detail above with reference to FIG. 4 are employed as components of time constant networks, current limiting elements, protection or filtering networks which are fully understood by the person skilled in the art, thereby not requiring further detailed description.

The embodiments of the invention described above are intended to be exemplary only. The scope of the invention is therefore intended to be limited solely by the scope of the appended claims.

The invention claimed is:

1. A self-powered lock system for a movable member, the system comprising:

an energy storage device having an electrical charge stored therein;

a generator coupled to the storage device and operatively connected to a lever of the movable member, displacement of the lever driving the generator to generate electrical energy and store the generated electrical energy in the storage device;

a lock mechanism having a first state in which the movable member is locked and a second state in which the movable member is unlocked;

a control unit coupled to the lock mechanism and adapted to place the lock mechanism in one of the first state and the second state;

a trigger unit adapted to be activated with the lock mechanism in the first state, the trigger unit comprising a keypad having a plurality of keys; and a passive detection unit coupled to the trigger unit and to the control unit, the detection unit detecting activation of any one of the plurality of keys while consuming substantially no electrical energy and, upon detection of the activation, providing a conductive path between the control unit and the storage device, thereby powering the control unit with the stored electrical charge, the control unit, upon being powered, placing the lock mechanism in the second state.

2. The system of claim 1, wherein the detection unit further interrupts the conductive path between the control unit and the storage device a first predetermined period of time after the lock mechanism is placed in the second state.

3. The system of claim 2, wherein the control unit further places the lock mechanism in the first state after a second predetermined period of time smaller than the first predetermined period of time.

4. The system of claim 1, wherein, upon detecting activation of any one of the plurality of keys, the detection unit further compares a level of the electrical charge stored in the storage device to a predetermined threshold.

5. The system of claim 4, wherein, if the charge level is below the threshold, the detection unit causes the control unit to trigger the storage of the generated electrical energy in the storage device prior to providing the conductive path between the control unit and the storage device.

6. The system of claim 1, wherein the keypad acts as an authentication unit, and upon being powered, the control unit receives a sequence of activated keys from the keypad, the sequence indicative of a user identification, and places the lock mechanism in the second state upon validation of the user identification.

7. The system of claim 1, wherein displacement of the lever causes the generator to generate electrical energy and store the generated electrical energy in the storage device for a subsequent use of the lock system, and the stored electrical energy is not consumed until the subsequent use.

8. A control system for controlling a self-powered electronic lock for a movable member having a lever, the lock comprising an electrical energy generator and a lock mechanism having a first state in which the movable member is locked and a second state in which the movable member is unlocked, the control system comprising:

an energy storage device having an electrical charge stored therein;

a control unit coupled to the lock mechanism and adapted to place the lock mechanism in one of the first state and the second state;

a trigger unit adapted to be activated with the lock mechanism in the first state, the trigger unit comprising a keypad having a plurality of keys; and a passive detection unit coupled to the trigger unit and to the control unit, the detection unit detecting activation of any one of the plurality of keys while consuming substantially no electrical energy and, upon detection of the activation, providing a conductive path between the control unit and the storage device, thereby powering the control unit with the stored electrical charge, the control unit, upon being powered, placing the lock mechanism in the second state, and when a lever of the movable member is displaced, triggering a storage of the generated electrical energy in the storage device for future use in powering the control unit.

9. The system of claim 8, wherein the detection unit further interrupts the conductive path between the control unit and the storage device a first predetermined period of time after the lock mechanism is placed in the second state.

10. The system of claim 9, wherein the control unit places the lock mechanism in the first state after a second predetermined period of time smaller than the first predetermined period of time.

11. The system of claim 8, wherein, upon detecting activation of any one of the plurality of keys, the detection unit further compares a level of the electrical charge stored in the storage device to a predetermined threshold.

12. The system of claim 11, wherein, if the charge level is below the threshold, the detection unit causes the control unit to trigger the storage of the generated electrical energy in the storage device prior to providing the conductive path between the control unit and the storage device.

13. The system of claim 8, wherein the keypad acts as an authentication unit, and upon being powered, the control unit receives a sequence of activated keys from the keypad, the sequence indicative of a user identification, and places the lock mechanism in the second state upon validation of the user identification.

14. A method for controlling an electronic lock of a movable member, the method comprising:

passively detecting an activation of at least one key on a keypad having a plurality of keys comprised in a trigger unit while the lock is in a locked state and while consuming substantially no electrical energy;

upon said detection, providing a conductive path between a control unit coupled to the lock and a storage device having an electrical charge stored therein, thereby powering the control unit with the stored electrical charge;

upon said powering, the control unit placing the lock in an unlocked state; and charging the storage device for a next use with electrical energy generated by a generator coupled to the storage device and operatively connected to a lever of the movable member, the electrical energy generated upon displacement of the lever of the movable member.

15. The method of claim 14, further comprising interrupting the conductive path between the control unit and the storage device a first predetermined period of time after the lock is placed in the unlocked state.

16. The method of claim 15, further comprising the control unit placing the lock in the locked state after a second predetermined period of time smaller than the first predetermined period of time.

17. The method of claim 14, further comprising, upon said detecting, comparing a level of the electrical charge stored in the storage device to a predetermined threshold.

18. The method of claim 17, further comprising, if the charge level is below the threshold, charging the storage device with the generated electrical energy prior to providing the conductive path between the control unit and the storage device.

19. The method of claim 14, further comprising:

receiving a sequence of activated keys from the keypad, the sequence indicative of a user identification; and placing the lock into the unlocked state upon validation of the user identification.

* * * * *